United States Patent [19]
Yokoyama et al.

[11] Patent Number: 5,483,919
[45] Date of Patent: Jan. 16, 1996

[54] ATOMIC LAYER EPITAXY METHOD AND APPARATUS

[75] Inventors: Haruki Yokoyama; Masanori Shinohara, both of Kanagawa, Japan

[73] Assignee: Nippon Telegraph and Telephone Corporation, Tokyo, Japan

[21] Appl. No.: 291,334

[22] Filed: Aug. 17, 1994

Related U.S. Application Data

[63] Continuation of Ser. No. 748,684, Aug. 22, 1991, abandoned.

[30] Foreign Application Priority Data

Aug. 31, 1990 [JP] Japan .................................. 2-231413
May 10, 1991 [JP] Japan .................................. 3-135670

[51] Int. Cl.$^6$ ......................................... C30B 25/19
[52] U.S. Cl. ................................. 117/89; 117/91; 117/99; 117/102; 117/954
[58] Field of Search .................. 117/89, 91, 99, 117/102, 954

[56] References Cited

U.S. PATENT DOCUMENTS

| | | | |
|---|---|---|---|
| 4,058,430 | 11/1977 | Suntola et al. | 156/611 |
| 4,636,268 | 1/1987 | Tsang | 156/611 |
| 4,645,687 | 2/1987 | Donnelly et al. | 156/613 |
| 4,806,321 | 2/1989 | Nishizawa et al. | 156/611 |
| 4,861,417 | 8/1989 | Mochizuki et al. | 156/611 |
| 4,886,683 | 12/1989 | Hoke et al. | 437/245 |
| 5,025,751 | 6/1991 | Takatani et al. | 156/611 |
| 5,156,815 | 10/1992 | Streetman | 156/611 |
| 5,171,610 | 12/1992 | Lui | 127/124 |

FOREIGN PATENT DOCUMENTS

| | | |
|---|---|---|
| 62-7699 | 1/1987 | Japan . |
| 63-156094 | 6/1988 | Japan . |
| 63-266814 | 11/1988 | Japan . |
| 63-266816 | 11/1988 | Japan . |
| 1-103996 | 4/1989 | Japan . |

OTHER PUBLICATIONS

A. Usui et al., "GaAs Atomic Layer Epitaxy by Hydride VPE", Japanese Journal of Applied Physics, vol. 25, No. 3, Mar., 1986, pp. L212–L214.

*Primary Examiner*—Robert Kunemund
*Attorney, Agent, or Firm*—Blakely, Sokoloff, Taylor & Zafman

[57] ABSTRACT

An atomic layer epitaxy method uses an organometal consisting of a metal and an alkyl group and having a self-limiting mechanism. At least one bond between the metal and the alkyl group of the organometal is dissociated, and organometal molecules consisting of the metal and the alkyl group, and a hydride or organometal molecules consisting of a different metal are alternately supplied on a substrate while at least one bond is left, thereby growing an atomic layer on the substrate. An atomic layer epitaxy apparatus is also disclosed.

7 Claims, 5 Drawing Sheets

ATOMIC LAYER EPITAXY METHOD AND APPARATUS

This is a continuation of application Ser. No. 07/748,684 filed Aug. 22, 1991 now abandoned.

BACKGROUND OF THE INVENTION

The present invention relates to an atomic layer epitaxy method and an apparatus therefor and, more particularly, to a compound semiconductor atomic layer epitaxy method using molecules having a self-limiting mechanism as one source material and an apparatus therefor.

In a conventional atomic layer epitaxy method, in order to grow GaAs crystals, for example, trimethylgallium [TMG, $(CH_3)_3Ga$] as an organometal gas and arsine [$ASH_3$] are used as a Ga source material and an As source material, respectively, and alternately supplied on a substrate crystal. In this atomic layer epitaxy method, when TMG is supplied, a part of an alkyl group of TMG is chemically removed and chemically bonded to As on the substrate surface to form one Ga layer on the As substrate crystal. Since TMG which subsequently flies onto the formed layer is not adsorbed, the growth is stopped when one Ga monolayer is formed. This mechanism is called a self-limiting mechanism, and atomic layer epitaxy is achieved by using this mechanism. Such a conventional atomic layer epitaxy method is performed at a comparatively low substrate temperature (about 500° C.) under the condition of a very narrow growth temperature margin.

This is because if all chemical bondings of three alkyl groups and Ga atoms are thermally dissociated to form atomic Ga in a vapor phase before TMG's reaching the substrate surface, Ga adheres on Ga resulting in growth in units of atomic layers. That is, self-limiting mechanism is damaged in the atomic Ga. Consequently, in the conventional method, the upper limit of the growth temperature is defined by a temperature Th at which thermal dissociation of the source material in vapor phase occurs. On the other hand, if the growth temperature is too low, the source material gas cannot be chemically bonded to atoms on the substrate surface leading to fail in growth of an atomic layer. Therefore, the lower limit of the growth temperature is defined by a temperature Tl at which the source material is chemically bonded with the substrate surface atoms and grown (bonded) by one atomic layer. The values of Th and Tl depend on the type of a source material gas. In GaAs growth using TMG, for example, Th is about 500° C., and Tl is about 490° C. That is, the difference between the two temperatures, i.e., a growth temperature range within which an atomic layer can be grown is only 10° C. This is the reason for the narrow growth temperature margin of the atomic layer epitaxy method.

Conventionally, the growth of GaAs is realized although the growth temperature range is narrow as described above. However, it is difficult to realize a compound semiconductor containing Al atoms such as AlAs or AlGaAs. This is because, although an organometal in which three methyl groups or ethyl groups are bonded to Al metal is normally used, atomic layer epitaxy cannot be performed since no temperature difference is present between Th and Tl. In order to solve this problem, a chloride of Al or a compound in which a part of an alkyl group bonded to Al metal is substituted by chlorine, e.g., diethylaluminumchloride [$(CH_3)_2AlCl$] is used as a source material. In addition, a method of thermally dissociating the source material to remove a methyl group before supplying the material is also performed. Since AlCl as a product is unstable, however, AlCl chemically reacts with each other to produce atomic Al in a vapor phase and thus self-limiting mechanism is damaged, thereby disabling atomic layer epitaxy. This means that it is impossible to realize atomic layer epitaxy of a hetero structure (e.g., GaAs/AlGaAs or GaAs/AlAs) which is essential in a device structure.

In addition, in the atomic layer epitaxy method, the source material gas contains an alkyl group, and the alkyl group is finally decomposed on the substrate surface, as described above. Therefore, carbon in the alkyl group is mixed as an impurity in crystals. The carbon concentration reaches $10^{18}/cm^3$ in normal GaAs crystals. Therefore, since it is difficult to realize high-purity crystal growth by this method, the atomic layer epitaxy method is prevented from being put into practical use.

SUMMARY OF THE INVENTION

It is, therefore, a principal object of the present invention to provide an atomic layer epitaxy method in which a growth temperature margin can be widened as compared to conventional methods.

It is another object of the present invention to provide an atomic layer epitaxy method capable of growing a composition which cannot be grown in conventional methods.

It is still another object of the present invention to provide an atomic layer crystal growth method capable of realizing high-purity crystals having a carbon impurity concentration lower than those in conventional methods.

In order to achieve the above objects, according to one aspect of the present invention, there is provided a compound semiconductor atomic layer epitaxy method of alternately supplying an organometal consisting of a metal and an alkyl group and having a self growth-limiting mechanism, wherein before molecules reach a substrate surface, at least one alkyl group bond which is bonded to the metal is thermally dissociated and at least one alkyl group bond is left, and then the organometals are supplied on the substrate to form an atomic layer, or the bond is thermally dissociated in a hydrogen atmosphere and a hydrogen atom is bonded to the dissociated bond, and then the organometals are supplied to the substrate to form an atomic layer. The method of the present invention is different from the conventional atomic layer epitaxy method in that the organometals are supplied to the substrate surface while they contain nondecomposed alkyl groups.

With this arrangement, before the molecules to be grow reach the substrate surface, at least one alkyl group bond bonded to the metal is thermally dissociated and supplied by alkyl radical molecules to the substrate for growth, thereby reducing an energy necessary to bond to the substrate atoms. Alternatively, the bond is thermally dissociated in a hydrogen atmosphere and supplied as a comparatively stable hydride to the substrate for growth, thereby obtaining a difference between thermal decomposition temperatures on the substrate surface caused by a difference between bond types. By these effects, the atomic layer epitaxial temperature range can be widened, and a carbon impurity concentration in crystals can be reduced.

DETAILED DESCRIPTION OF THE PREFERRED EMBODIMENTS

Embodiments of the present invention will be described below.

Figure 1:
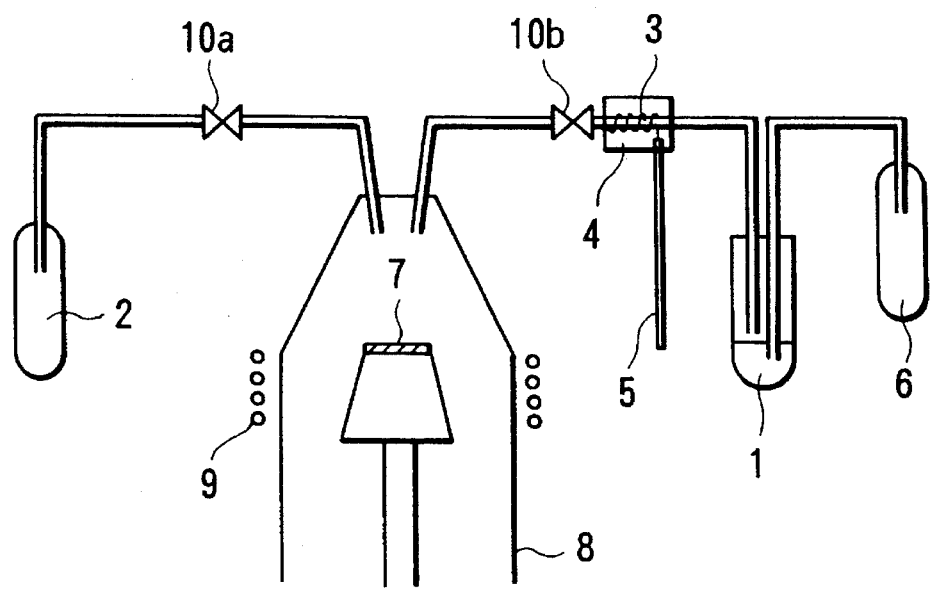
FIG. 1 is a block diagram showing an apparatus according to an embodiment of the present invention.

FIG. 1 shows an apparatus for realizing an atomic layer epitaxy as the first embodiment of an atomic layer epitaxy method according to the present invention. Referring to FIG. 1, reference numeral 1 denotes a tank containing trimethylgallium as a Column III source material; 2, a tank containing arsine as a Column V source material; 3, a cracking tube, the temperature of which is independently controlled to thermally dissociate an alkyl group of a part of trimethylgallium; 4, a heater wound around the cracking tube 3 to control the temperature; 5, a thermocouple for monitoring the internal temperature of the cracking tube 3; 6, tank containing a carrier gas for carrying trimethylgallium and controlling the internal atmosphere of the cracking tube 3; 7, a substrate for growth placed on a suitable support table such as a carbon susceptor; 8, a reaction tube; 9, an RF (high-frequency) coil for controlling the substrate temperature; and 10a and 10b, stop valves for supply control of the source materials.

Figure 2:
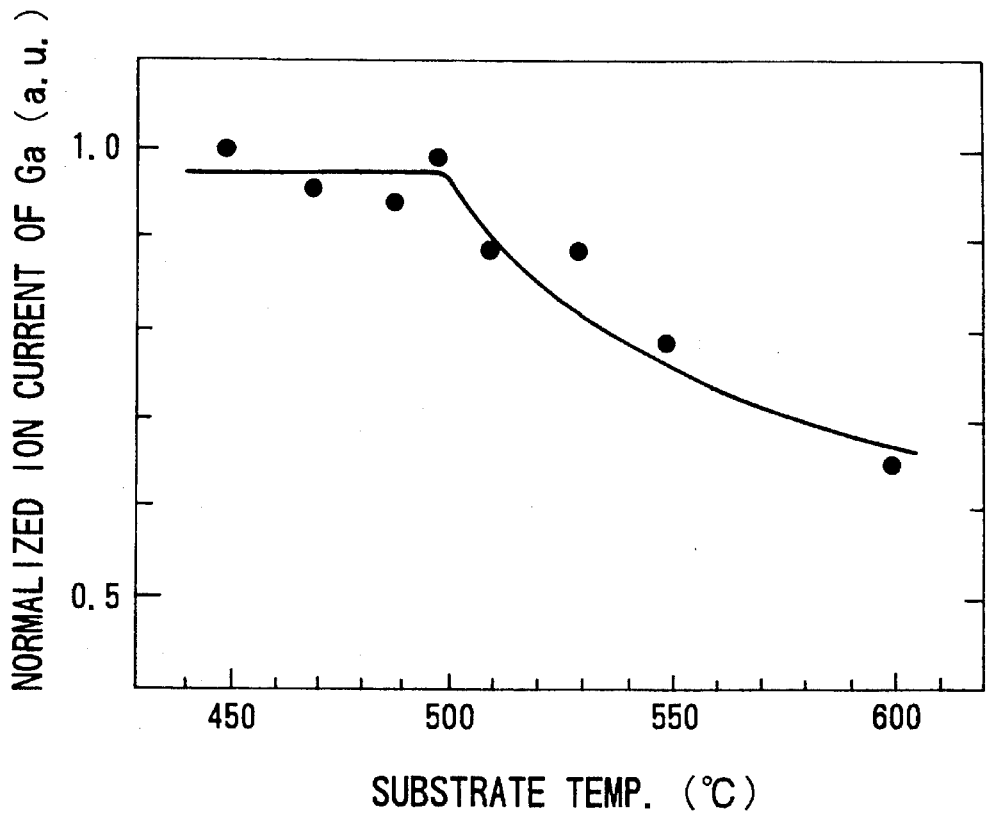
FIG. 2 is a graph showing the results obtained by checking thermal decomposition characteristic of trimethylgallium in a nitrogen atmosphere by a quadrupole mass spectrometer.

FIG. 2 shows the results obtained by checking the thermal decomposition characteristic of trimethylgallium in a nitrogen atmosphere by a quadruple mass spectrometer, in which a peak intensity change of Ga generated upon decomposition of trimethylgallium is illustrated. Referring to FIG. 2, the abscissa indicates the substrate temperature, and the ordinate indicates the normalized ion current of Ga. In FIG. 2, a region where the peak intensity is constant indicates a Ga amount decomposed in the quadruple mass spectrometer. A reduction in peak intensity at 520° C. or more indicates that trimethylgallium decomposes in the nitrogen atmosphere. The peak intensity is reduced because some of the decomposed molecular species adhere on the wall surface of the cracking tube to decrease the amount of trimethylgallium analyzed by the quadruple mass spectrometer.

Figure 3:
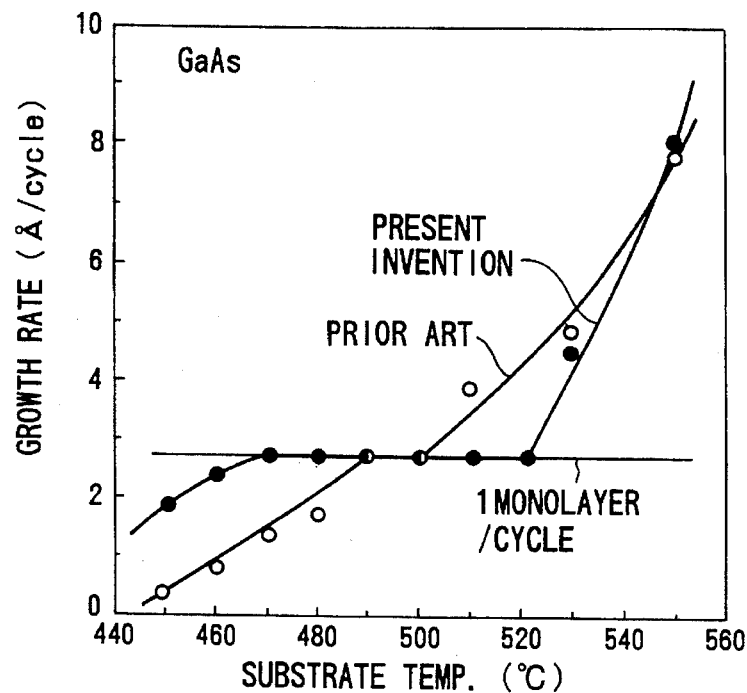
FIG. 3 is a graph for explaining the effect of the first embodiment of the present invention, in which a relationship between the growth rate of GaAs crystals and the substrate temperature according to each of the present invention and a conventional example is illustrated.

FIG. 3 shows a relationship between the growth rate and the substrate temperature obtained when the internal temperature of the cracking tube 3 shown in FIG. 1 was controlled to be 540° C. at which trimethylgallium is decomposed, nitrogen was flowed as a carrier gas from the tank 6 at a flow rate of two l/min., the flow rate of trimethylgallium in the cracking tube 3 was set at $1.6 \times 10^{-6}$ mol/cycle, and the flow rate of arsine from the tank 2 was set at $7 \times 10^{-6}$ mol/cycle, thereby growing GaAs by a sequence of trimethylgallium supply:purge:arsine supply:purge=one sec.:three sec.:one sec.:three sec. per cycle. In FIG. 3, the abscissa indicates the substrate temperature, and the ordinate indicates the growth rate. Referring to FIG. 3, symbol · represents the growth result of the present invention; and o, that of a conventional method (in which a hydrogen carrier gas was used to supply trimethylgallium without decomposing it). As indicated by ·, the growth rate is maintained constant at 2.8 Å/cycle in a region where the substrate temperature is 460° C. to 520° C. This value corresponds to the thickness of one GaAs monolayer, i.e., atomic layer epitaxy is realized. In the conventional method, however, a region where the growth rate is maintained constant is only 10° C. from 490° C. to 500° C.

Figure 4:
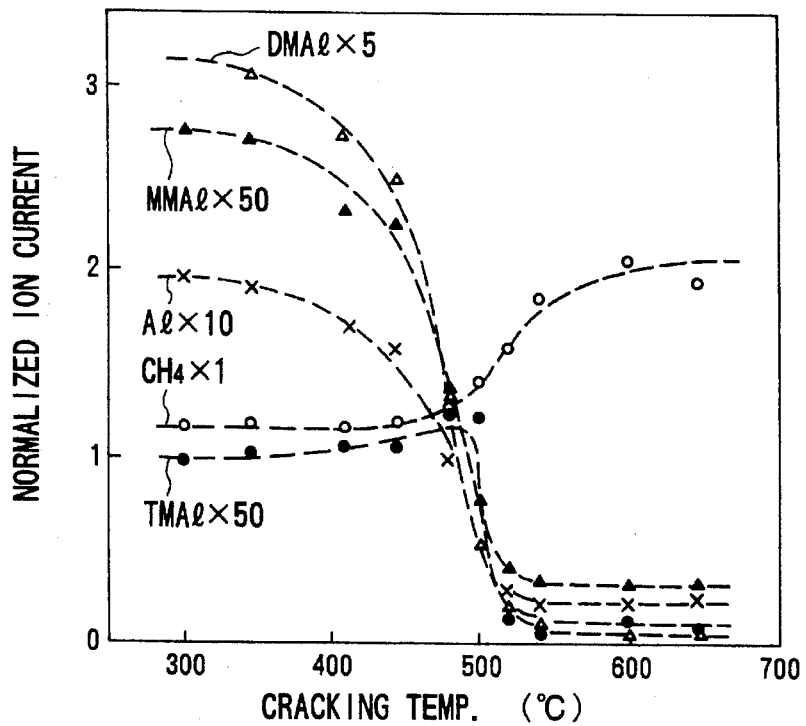
FIG. 4 is a graph showing decomposition characteristic of trimethylaluminum in a hydrogen atmosphere.

The second embodiment of the present invention in which a source material gas is thermally decomposed and then supplied on a substrate as a hydride will be described below by taking atomic layer epitaxy of AlAs as an example. FIG. 4 shows the decomposition characteristic of trimethylaluminum in a hydrogen atmosphere, which is the basis of obtaining the set temperature of the cracking tube 3 shown in FIG. 1. In FIG. 4, the abscissa indicates the cracking temperature, and the ordinate indicates the normalized ion current. Similar to FIG. 2, the measurement results shown in FIG. 4 are obtained by the quadruple mass spectrometer, in which decomposition of trimethylaluminum starts from a temperature of about 380° C. from which the peak is decreased. In this embodiment, the internal temperature of the cracking tube 3 was set at 400° C. Note that in FIG. 4, DMAI represents dimethylaluminum; MMAI, monomethylaluminum; Al, aluminum; $CH_4$, methane; and TMAI, trimethylaluminum, and the value on the right side of each material name represents a magnification by which each measurement value is magnified.

Figure 5:
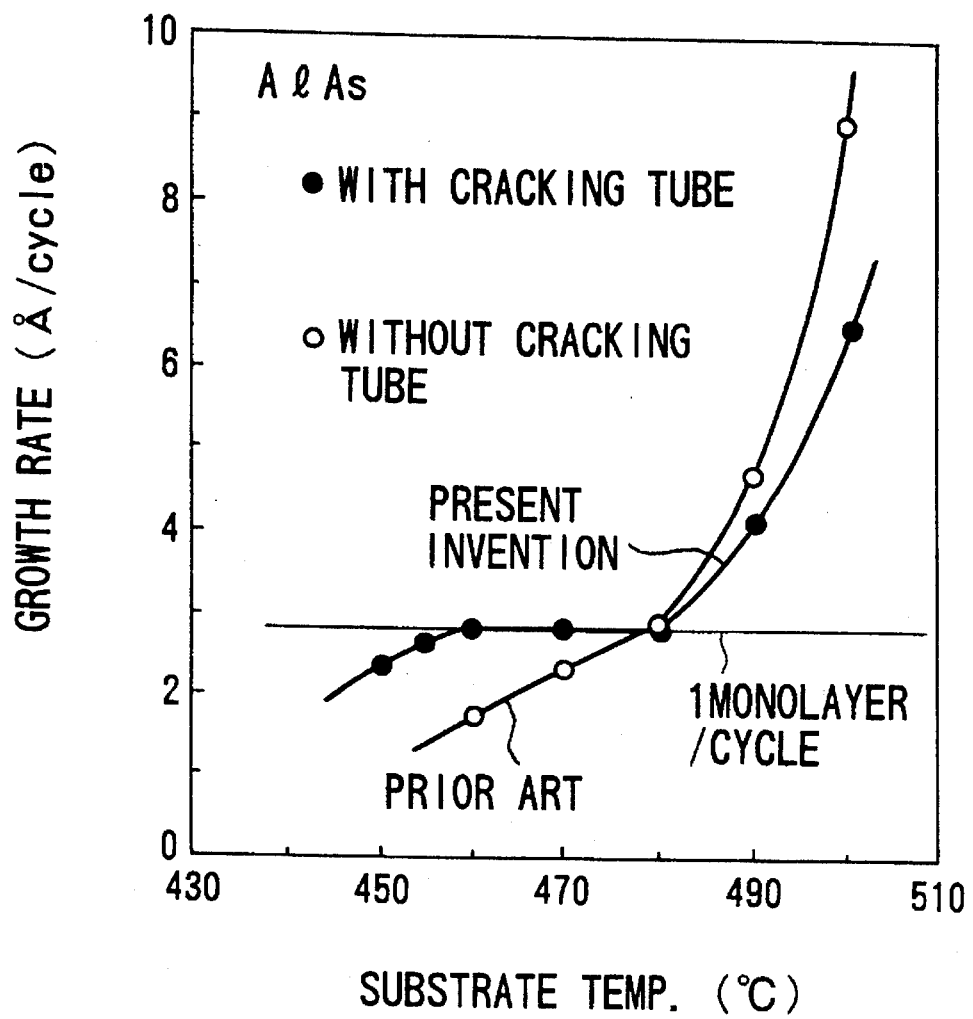
FIG. 5 is a graph for explaining the effect of the second embodiment of the present invention, in which a relationship between the growth rate of Al crystals and the substrate temperature according to each of the present invention and a conventional example is illustrated.

FIG. 5 shows atomic layer epitaxy of AlAs realized by the present invention, in which the abscissa indicates the substrate temperature and the ordinate indicates the growth rate. FIG. 5 shows a relationship between the growth rate and the substrate temperature obtained when hydrogen was flowed as a carrier gas from the tank 6 at a flow rate of two l/min., trimethylaluminum was flowed as a Column III source material from the tank 1 at a flow rate of $1 \times 10^{-6}$ mol/cycle, and the flow rate of arsine from the tank 2 was set at $7 \times 10^{-6}$ mol/cycle, thereby growing AlAs by a sequence of trimethylaluminum supply:purge:arsine supply:purge=one sec.:three sec.:one sec.:three sec. per cycle. Referring to FIG. 5, symbol · represents the growth result of the present invention; and o, that of a conventional method (in which trimethylaluminum was supplied without being decomposed). As indicated by ·, the growth rate was maintained constant at 2.8 Å/cycle in a region where the substrate temperature was 460° C. to 480° C. This value corresponds to the thickness of one AlAs monolayer, i.e., atomic layer epitaxy is realized. In the conventional method, on the other hand, no region where the growth rate is maintained constant is present, i.e., no atomic layer epitaxy is realized.

Figure 6:
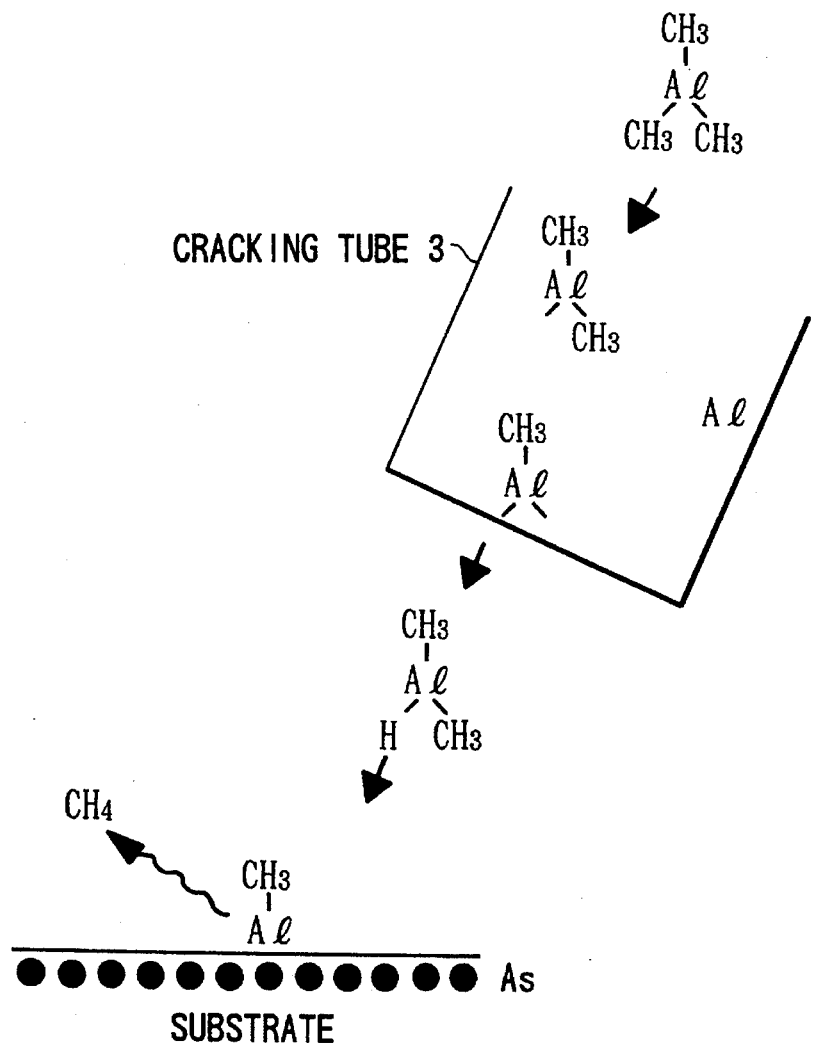
FIG. 6 is a view for explaining why atomic layer epitaxy of AlAs is realized.

FIG. 6 is a view for explaining the reason why the atomic layer epitaxy of AlAs shown in FIG. 4 was realized, in which a change in molecules of trimethylaluminum before and after flowing through the cracking tube 3 shown in FIG. 1 is illustrated. When trimethylaluminum is flowed through the cracking tube 3 at 400° C. it is thermally dissociated into dimethylaluminum atom, monomethylaluminum atom, and Al atoms. The Al atoms do not go outside the cracking tube 3 but adhere on the inner wall of the cracking tube. A hydrogen atom is bonded to an extra bond of dimethylaluminum to form dimethylaluminumhydride [$H(CH_3)_2Al$]. This reaction easily occurs because the bonding energy between Al and hydrogen is higher than that between Al and a methyl group and dimethylaluminumhydride is a stable compound. Although hydrogen atoms are bonded to two extra bonds of monomethylaluminum, this compound is changed into stable dimethylaluminumhydride because it is an unstable compound. Therefore, molecules supplied to the substrate are dimethylaluminumhydride. Since hydrogen atoms of dimethylaluminumhydride reaching the substrate surface are dissociated upon reaction between Al and As on the substrate surface, chemical bonding between Al and As easily occurs even at a comparatively low temperature. A method of using dimethylaluminumhydride in place of trimethylaluminum may be performed. In this case, however, it is difficult to obtain a sufficient flow rate because a vapor pressure value is 1/10 or less as compared with trimethylaluminum, and conduits to the source gas cylinders or the reaction tube must be constantly maintained at a high temperature of about 90° C. Therefore, this method has a problem in liquefaction in the conduits or reliability of the stop valves and the mass flowmeter. The present invention can perfectly solve this problem.

The reason why the temperature region of the GaAs atomic layer epitaxy shown in FIG. 3 is widened toward the low temperature side will be described below with reference to FIG. 6. That is, trimethylgallium is decomposed in the cracking tube 3 to generate radicals of, e.g., dimethylgallium or monomethylgallium and Ga. The Ga atoms do not go outside the cracking tube but are adsorbed on the wall of the cracking tube. The radicals are not bonded to nitrogen in the atmosphere but reach the substrate surface. Since these radicals have dangling bonds, they are adsorbed at a low temperature without requiring adsorption energy with As.

Figure 7:
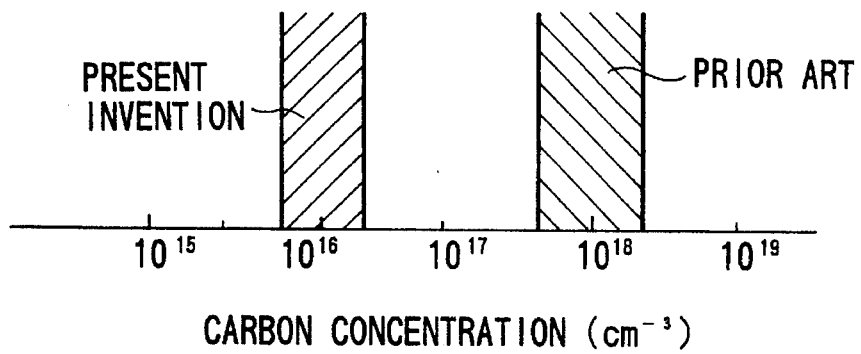
FIG. 7 is a view for explaining the effect of the present invention, in which a carbon impurity concentration in AlAs crystals according to each of the present invention and a conventional example is illustrated.

FIG. 7 shows an embodiment in which a reduction in carbon concentration is achieved by the present invention, in which the carbon concentration of AlAs grown by supplying trimethylaluminum into the cracking tube 3 of the apparatus shown in FIG. 1 is illustrated. The epitaxial conditions are the same as those shown in FIG. 5. The significant effect of the present invention is confirmed because the carbon concentration is reduced to from 1/10 to 1/100 of that in the conventional method. The molecules passing through the cracking tube 3 become dimethylaluminumhydride, and dimethylaluminumhydride is supplied to the substrate surface to dissociate hydrogen atoms. The dissociated hydrogen atom reacts with a methyl group, which is a source of carbon and bonded to Al, and are removed as methane. Therefore, crystals with less carbon can be grown.

In the above embodiment, organometal gases of trimethylgallium and trimethylaluminum are used. However, a similar effect can be obtained by using an organometal bonded to another metals or a Column II–VI source material such as a ZnS compound or a ZnSe compound.

Figure 8:
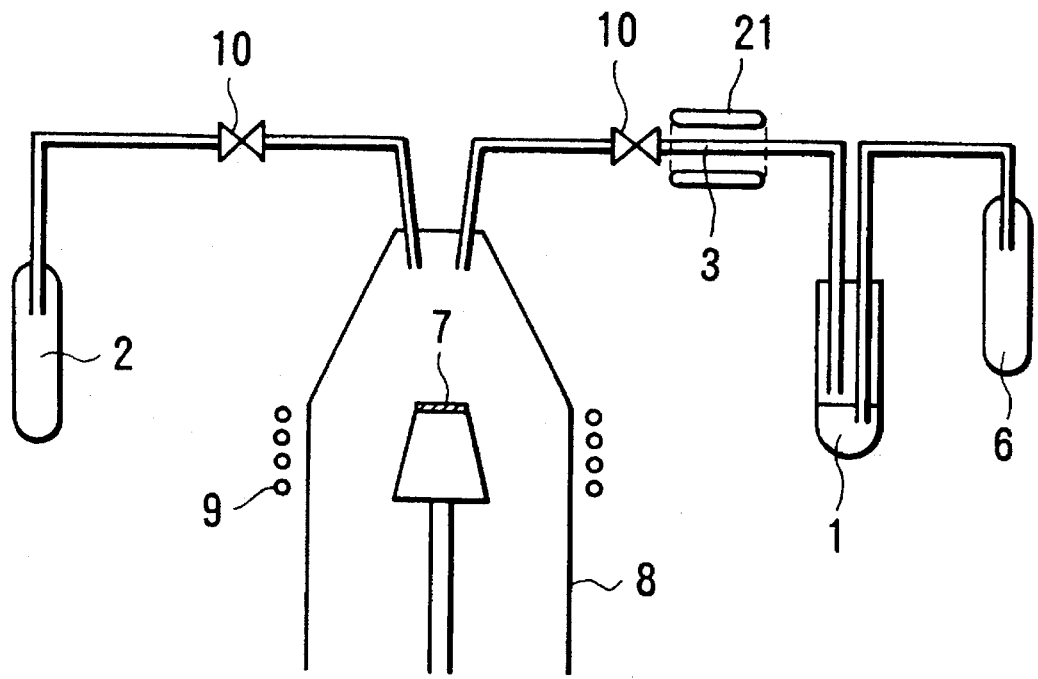
FIGS. 8 and 9 are block diagrams each showing an apparatus according to still another embodiment of the present invention.

FIG. 8 shows an apparatus for realizing dissociation with light upon dissociation of bonds of a Column III organometal gas. In this apparatus, a halogen lamp 21 is used as a light source, and TMA reaches the surface of a substrate 7 through a cracking tube 3 irradiated with light. The other conditions were set to be the same as those in FIG. 5, and atomic layer epitaxy of AlAs was realized as in the second embodiment of the present invention.

Figure 9:
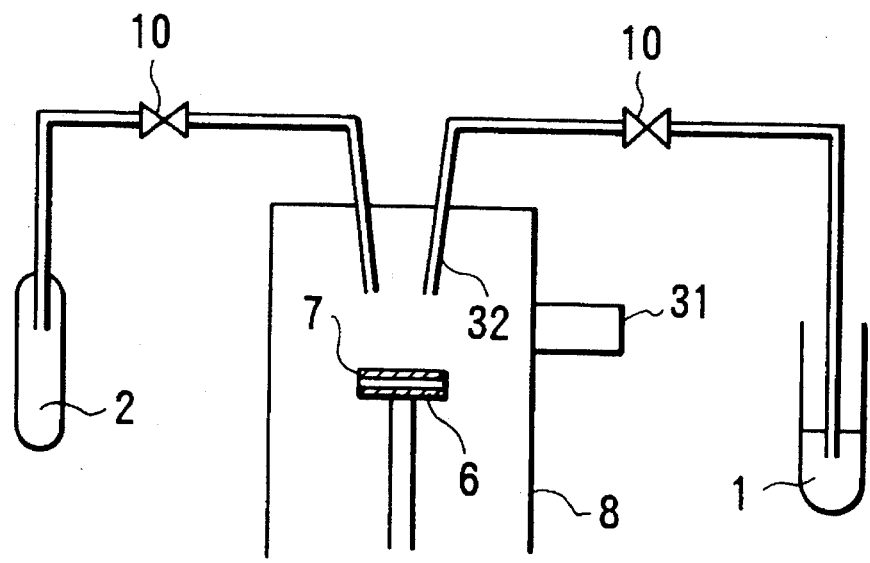

FIG. 9 shows an apparatus for realizing dissociation with an electron beam upon dissociation of bonds of a Column III organometal gas. In this apparatus, the positions of an electron gun 31 and a TMA (trimethylaluminum) supply tube 32 are set such that only TMA from a tank 1 reaches the surface of a substrate 7 across an electron beam output from the electron gun 31. The acceleration voltage of the electron beam from the electron gun 31 was 20 KeV, the flow rate of TMA from the tank 1 was 1.5 sccm, the amount of arsine supply from a tank 2 was 2 sccm, the pressure in the reaction tube 8 was $8 \times 10^{-5}$ Torr, the supply time of TMA as a source material gas was five seconds, and the time for purging each gas was ten seconds. As a result, AlAs atomic layer epitaxy as shown in FIG. 5 was realized. In this embodiment, a substrate heater 6 for controlling the substrate temperature was arranged below the substrate 7.

As has been described above, according to the present invention, a source material is changed into molecules which are easily, chemically adsorbed on the surface of a substrate and then supplied to accelerate the adsorption efficiency at a low temperature, thereby realizing atomic layer epitaxy of a compound semiconductor which cannot be realized in conventional methods. In addition, since the carbon concentration in crystals can be reduced, low impurity (or high quality, or high purity) crystal growth is realized. This enables growth of various types of compound semiconductors, therefore, makes it possible to grow a hetero structure, essential in realization of a device. As a result, it is expected that the atomic layer epitaxy method is put into practical use, and the range of its applications is widened.

In other words, the present invention can be used to widen a crystal composition range which can be realized by an epitaxial method capable of precise control of the composition in the heterointerface and the film thickness uniformity, each having a large effect on device characteristics in units of atomic layers, or to reduce the concentration of carbon impurity contained in crystals, in an epitaxy technique for realizing a fine electronic device structure expected to perform a high-speed operation.

What is claimed is:

1. An atomic layer epitaxy method for obtaining a high-purity atomic layer comprising the steps of:

energizing at a first energization region an organometal consisting of a metal and an alkyl group and having a self-limiting mechanism;

flowing said energized organometal in a pipe provided at said first region so that unbound metal, detached from the organometal in which all bonds between the metal and alkyl group are cut, is removed by deposition to an inner wall of said pipe thereby preventing the unbound metal from reducing the effect of the self-limiting mechanism, at least one bond between the metal and the alkyl group of the organometal is dissociated and only an energized source having at least one bond is remaining; and flowing said energized source to a second region in which a substrate is set, so that said energized source and a hydride or organometal molecules consisting of a different metal are alternatively supplied on a substrate thereby growing the high-purity atomic layer on said substrate.

2. A method according to claim 1, wherein the organometal is selected from Column III and II metals, and the hydride or organometal molecules consisting of a different metal contain at least one element selected from Column V and VI elements.

3. A method according to claim 1, wherein a treatment of dissociating at least one bond between the metal and the alkyl group of the organometal is performed in a hydrogen gas atmosphere, and a subsequent treatment is performed after a hydrogen atom is bonded to the dissociated bond.

4. A method according to claim 1, wherein the dissociation is thermal dissociation.

5. A method according to claim 1, wherein the dissociation is treated in an inert gas atmosphere.

6. An atomic layer epitaxy method wherein an organometal consisting of a metal of Column III–V or Column II–VI and an alkyl group and having a self-limiting mechanism is used, at least one bond between the metal of Column III or II and the alkyl group is thermally dissociated while at least one bond is left, atomic metal is removed and organometal molecules containing the metal of Column III or II, and a hydride or organometal molecules containing a Column V or VI element are alternately supplied on a substrate, thereby growing an atomic layer.

7. An atomic layer epitaxy method wherein an organometal consisting of a metal of Column III or Column II and an alkyl group and having a self-limiting mechanism is used, at least one bond between the metal of Column III or II and the alkyl group is thermally dissociated while at least one bond is left, atomic metal is removed and organometal molecules containing the metal of Column III or II, and a hydride or organometal molecules containing a Column V or VI element are alternately supplied on a substrate, thereby growing an atomic layer.

* * * * *